United States Patent [19]

Uya

[11] 4,168,492

[45] Sep. 18, 1979

[54] TEMPERATURE COMPENSATED ANTILOGARITHMIC CONVERTER

[75] Inventor: Masaru Uya, Kadoma, Japan

[73] Assignee: Matsushita Electric Industrial Co., Ltd., Osaka, Japan

[21] Appl. No.: 795,554

[22] Filed: May 10, 1977

[30] Foreign Application Priority Data

May 17, 1976 [JP] Japan ................................. 51/56897

[51] Int. Cl.² .......................................... H03K 13/02
[52] U.S. Cl. ............................ 340/347 DA; 84/1.01; 307/310; 340/347 M; 340/347 CC
[58] Field of Search .... 340/347 M, 347 DA, 347 CC; 307/230, 310; 84/1.24, 1.26, 1.01

[56] References Cited

U.S. PATENT DOCUMENTS

| | | | |
|---|---|---|---|
| 3,653,033 | 3/1972 | Bonami et al. | 340/347 DA |
| 3,940,760 | 2/1976 | Brokaw | 340/347 DA |
| 3,952,624 | 4/1976 | Kawakami | 84/1.26 |
| 4,015,149 | 3/1977 | Tsunekawa et al. | 307/310 |
| 4,063,116 | 12/1977 | Schmoock | 307/310 X |

OTHER PUBLICATIONS

Clayton, Experiments with Operational Amplifiers; Using Transistors for Logarithmic Conversion, Wireless World, 1/1973, pp. 33–35.

Dobkin, Logarithmic Converters, IEEE Spectrum, 11/1969, pp. 69–72.

Primary Examiner—Thomas J. Sloyan
Attorney, Agent, or Firm—Wenderoth, Lind & Ponack

[57] ABSTRACT

A temperature-compensated antilogarithmic converter has a temperature-sensitive signal generator for generating a temperature dependent signal which varies in proportion to absolute temperature; a multiplying means for mixing and converting the temperature dependent signal and an input signal into a product signal; and a non-temperature compensated antilogarithmic amplifier for converting the product signal into a non-temperature compensated antilogarithm of the product signal, wherein by placing the temperature-sensitive element of the temperature-sensitive signal generator and the antilogarithmic element of the antilogarithmic amplifier at the same temperature, the dependance of the antilogarithmic amplifier is temperature compensated by the temperature dependent signal. Thereby, an output converted signal the voltage or current of which is stable with respect to temperature variation can be generated.

20 Claims, 3 Drawing Figures

TEMPERATURE COMPENSATED ANTILOGARITHMIC CONVERTER

This invention relates to a temperature-compensated antilogarithmic converter using semiconductor P-N junctions as antilogarithmic elements.

A conventional antilogarithmic converter uses, for example, semiconductor P-N junctions such as transistors or diodes as antilogarithmic elements. Generally, the voltage (V) to current (I) characteristic of a semiconductor P-N junction is represented by the following equation.

$$I = I_s \exp(qV/kT)$$

where, $I_s$ is the reverse saturation current, k is Boltzmann's constant, q is the electron charge and T is the absolute temperature. Thus, the equation for the P-N junction shows both the capability of antilogarithmic conversion and a factor of variation due to a variation of the absolute temperature T. Although the reverse saturation current $I_s$ is small, it varies in proportion to an exponent of the absolute temperature T. Therefore, most conventional antilogarithmic converters make use of a pair P-N junctions of transistors or diodes matched as to voltage to current characteristics. One of the pair of P-N junctions is used for converting voltage into current which is in proportion to the antilogarithm of the voltage, and the other of the pair of P-N junctions is used for compensating for the variation of current I due to variation of the absolute temperature T by a variation of the reverse saturation current $I_s$ due to variation of the absolute temperature T. However, it is theoretically impossible to completely compensate for the variations due to a change of temperature T by means of a pair for P-N junctions, because the term for temperature T is not in the coefficient term but in the exponential term of the characteristic equation described above.

Accordingly, most conventional antilogarithmic converters make use of a temperature-sensitive resistor such as a thermistor of a negative or positive temperature coefficient of resistance for cancelling the variation due to variation of the temperature T in the characteristic equation described above. In such a temperature-sensitive resistor the resistance varies in proportion to or in inverse proportion to absolute temperature. It is, therefore, impossible, for such a temperature-sensitive resistor or a combination of fixed resistors and such temperature-sensitive resistors, to completely compensate for variations due to change of temperature T over a wide and desired temperature range, because the temperature-resistance coefficient of such temperature-sensitive resistors is effectively nonlinear.

Moreover, even if one of the temperature-sensitive resistors happens to successfully carry out the temperature compensation, it cannot be expected that all of such temperature-sensitive resistors will completely succeed in such compensation when they are produced by mass production, because the values of both the temperature-resistance coefficient and the resistance of various temperature-sensitive resistors are spread over wide ranges. Any selection of desirable temperature-sensitive resistors from among those produced by mass production causes the cost of antilogarithmic converters to become high. Consequently, it has been very difficult to completely compensate for the variation due to temperature change and for the dispersion of characteristics in the converting characteristic of conventional antilogarithmic converters.

Therefore, an object of the present invention is to provide a temperature-compensated antilogarithmic converter which can product an input signal into a converted signal which varies in proportion both to the input signal and to absolute temperature, and then to generate an antilogarithm output signal the voltage or current of which is stable with respect to temperature variation.

This object is achieved according to the present invention by providing a temperature-compensated antilogarithmic converter which comprises: a temperature-sensitive signal generator including a first semiconductor device having at least one P-N junction as a temperature-sensitive element for generating at least one electric signal which varies in proportion to the absolute temperature of said first semiconductor device; a multiplying means for multiplying said at least one electric signal and an input signal applied to an input terminal thereof into a product signal which varies in proportion to both said input signal and absolute temperature; and an antilogarithmic amplifier connected to the output of said multiplying means and including a second semiconductor device having at least one P-N junction as an antilogarithmic element for product said converted signal into an antilogarithmic output signal which varies in proportion to an antilogarithm of a valve proportional to said product signal and inversely proportional to the absolute temperature of said second semoconductor device, wherein both said first and second semiconductor devices are exposed to substantially the same temperature as each other so as to temperature-compensate said antilogarithmic amplifier by said at least one electric signal. Thus said temperature-compensated antilogarithmic converter produces an output signal, i.e., said antilogarithmic output signal of said antilogarithic amplifier, which varies in proportion to the antilogarithm of said input signal of said multiplying means and which is stable with respect to temperature variation.

This and other objects and features of the present invention will be made clear from the following detailed description of embodiments thereof considered together with the accompanying drawings, wherein.

Figure 1:
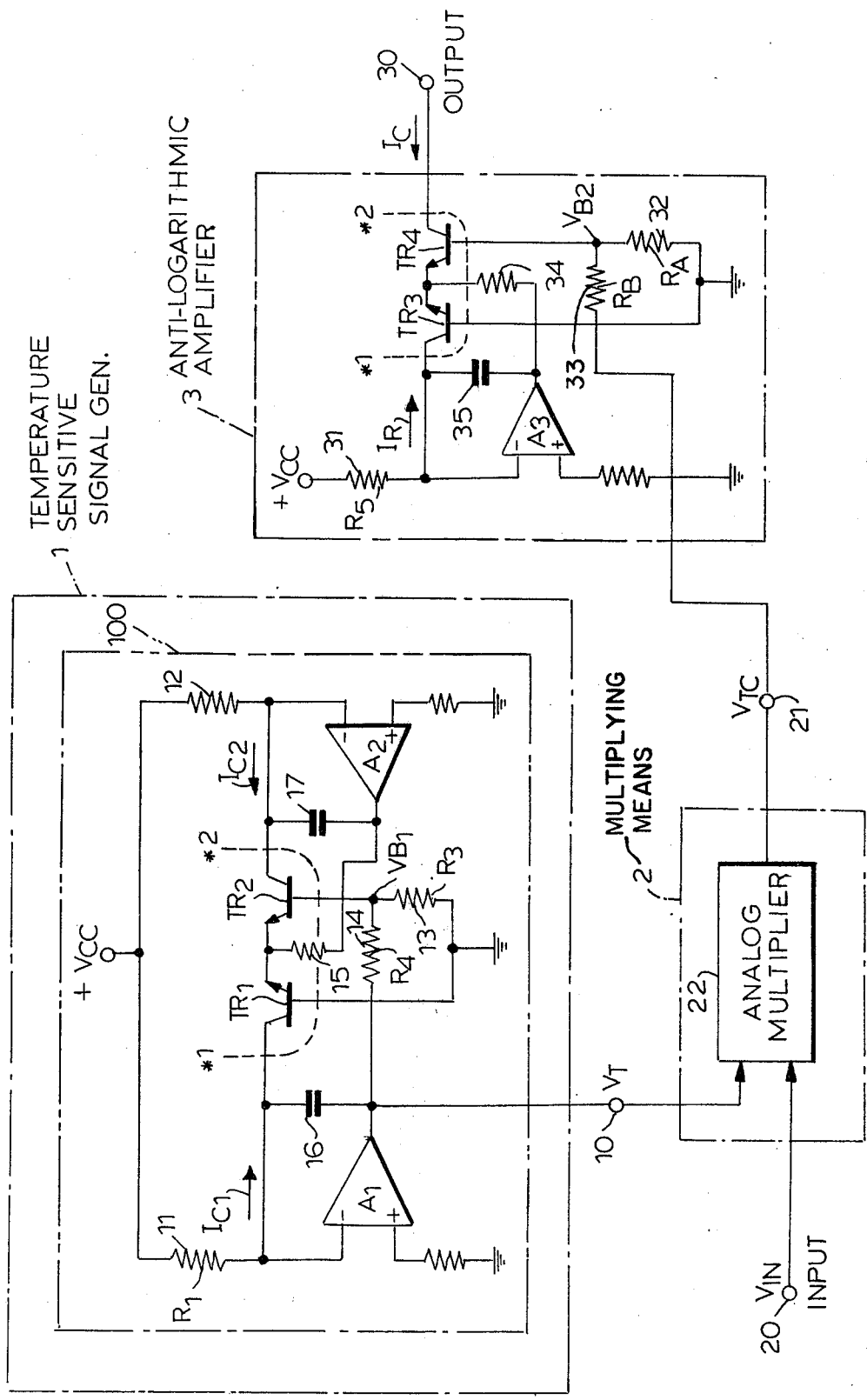
FIG. 1 is a circuit diagram of an embodiment of the temperature-compensated antilogarithmic converter of the present invention.

Referring to FIG. 1, a temperature-sensitive signal generator 1 includes a semiconductor device having at least one P-N junction as a temperature-sensitive element and generates at least one electric signal which varies in proportion to absolute temperature. The temperature-sensitive signal generator 1 comprises a temperature-sensitive voltage generator 100 which includes a pair of transistors $Tr_1$ and $Tr_2$ as a temperature-sensitive element and generates a temperature-sensitive voltage $V_T$ which varies in proportion to absolute temperature T (°K.). A multiplying means 2 converts an input signal applied to an input terminal thereof and the output electric signal of the temperature-sensitive signal generator 1 into a product signal which varies in proportion to both said input signal and absolute temperature T. The input signal applied to the converting means 2 can be not only an analogue electric signal, for example, such as analogue voltage or current, but also (i) a digital signal or a signal fed by a mechanical switch such as a keyswitch for an electronic musical instrument in the form of switched signal and (ii) a signal fed by a potentiometer in the form of divided signals. The input signal voltage $V_{IN}$ is applied to an input terminal 20 of the multiplying means 2. The multiplying means 2 comprises an analogue multiplier 22 which multiplies the input voltage $V_{IN}$ by the temperature-sensitive voltage $V_T$ applied to a terminal 10 so as to generate an output voltage $V_{TC}$ at a terminal 21 which varies in proportion to both the input voltage $V_{IN}$ and to the temperature-sensitive voltage $V_T$. An antilogarithmic amplifier 3 includes another semiconductor device having at least one P-N junction as an antilogarithmic element and converts the output electric signal of the multiplying means 2 into an antilogarithmic signal which is in proportion to the antilogarithm of the output electric signal of the multiplying means 2 and which is still temperature-uncompensated with respect to the antilogarithmic conversion characteristic thereof.

In FIG. 1, the antilogarithmic amplifier 3 includes a pair of transistors Tr$_3$ and Tr$_4$ as an antilogarithmic element and is supplied with the output voltage $V_{TC}$. The output voltage $V_{TC}$ is converted into an output current $I_C = A\ \exp(BV_{TC}/T)$, where T is absolute temperature (°K.), and both A and B are constants independent of absolute temperature T. The pair of transistors Tr$_1$ and Tr$_2$ included in the temperature-sensitive voltage generator 100 are exposed to substantially the same temperature as the pair of transistors Tr$_3$ and Tr$_4$ included in the antilogarithmic amplifier 3 as shown by dotted line *1-*2 in FIG. 1, so as to temperature-compensate the antilogarithmic amplifier 3 by the temperature-sensitive voltage $V_T$.

Before going into a detailed description of the embodiment in FIG. 1, it is pointed out that the explanation set forth hereinafter will be abbreviated as much as possible to provide an easy understanding of the embodiment thereof and of the scope of the present invention.

Because the temperature-sensitive voltage $V_T$ varies in proportion to absolute temperature T, it is expressed as $V_T = K_T T$, where $K_T$ is a proportional constant independent of absolute temperature T. The output voltage $V_{TC}$ of the analogue multiplier 22 is expressed as $V_{TC} = MV_{IN}V_T = MK_T V_{IN}T$, where M is a proportional constant independent of absolute temperature T. As described hereinbefore, the output current $I_C$ of the antilogarithmic amplifier 3 is expressed as $I_C A\ \exp(BV_{TC}/T)$. Substituting the equation expressing $V_{TC}$ for the equation expressing $I_C$, the output current $I_C$ is given by the following equation;

$$I_C = A\ \exp(BMK_T V_{IN} T/T) = A\ \exp(BMK_T V_{IN})$$

Consequently, as absolute temperature T is cancelled in the above equation, the output current $I_C$ converted by the antilogarithmic amplifier 3 is stable with respect to temperature variation.

Referring now more particularly to FIG. 1 in detail, a circuit diagram of a concrete embodiment of the temperature-sensitive voltage generator 100 is shown. The temperature-sensitive voltage generator 100 comprises differential amplifiers A$_1$ and A$_2$ each having a high imput impedance and a pair of transistors Tr$_1$ and Tr$_2$ well matched in $V_{BE}$(base-emitter voltage) vs. $I_C$ (collector current) characteristics with each other, resistors 11, 12 and 13 which are stable with respect to temperature variation, capacitors 16 and 17, and a resistor 15. Noninverting inputs of the differential amplifiers A$_1$ and A$_2$ are grounded through further resistors which cancel offset voltages caused by respective input bias currents thereof. Capacitors 16 and 17 and the resistor 15 are used to assure frequency stability of the temperature-sensitive voltage generator 100.

In the case when the collector potential is nearly equal to the base potential, the relationships between base-emitter voltages $V_{BE1}$ and $V_{BE2}$ of the pair of transistors Tr$_1$ and Tr$_2$ and collector currents $I_{C1}$ and $I_{C2}$ thereof are represented by the following equations, respectively;

$$I_{C1} = I_{S1}\ \exp(qV_{BE1}/kT) \tag{1}$$

$$I_{C2} = I_{S2}\ \exp(qV_{BE2}/kT) \tag{2}$$

where $I_{S1}$ and $I_{S2}$ are the reverse saturation currents of the pair transistors Tr$_1$ and Tr$_2$, respectively, k is Boltzmann's constant, q is an electron charge and T is the absolute temperature (°K.). Because the differential amplifier A$_1$ is negatively fed back through the resistor 14 and the pair transistors Tr$_2$ and Tr$_1$, the potential of the inverting input thereof becomes the ground potential. Similarly, because the differential amplifier A$_2$ is negatively fed back through the resistor 15 and the transistor Tr$_2$, the potential of the inverting input thereof becomes the ground potential. Since the input impedances of the differential amplifiers A$_1$ and A$_2$ are sufficiently high, the collector currents $I_{C1}$ and $I_{C2}$ are given by the following equations, respectively;

$$I_{C1} = V_{CC}/R_1 \tag{3}$$

$$I_{C2} = V_{CC}/R_2 \tag{4}$$

where $V_{CC}$ is the voltage of the power supply. The relationship between $V_T$ and $V_{B1}$ is given by the following equation;

$$V_{B1} = [R_3/(R_3 + R_4)]V_T \tag{5}$$

where $V_T$ is the output voltage of the differential amplifier A$_1$ and $V_{B1}$ is the base voltage of the transistor Tr$_2$, respectively.

Since the base of the transistor Tr$_1$ is grounded and the emitter of the transistor Tr$_1$ is coupled with that of the transistor Tr$_2$, the following equation is obtained;

$$V_{BE2} - V_{BE1} = V_{B1} \tag{6}$$

Dividing equation (2) by equation (1), the following equation is obtained;

$$I_{C2}/I_{C1} = (I_{S2}/I_{S1})\ \exp[q(V_{BE2} - V_{BE1})/kT]$$

Thus, because the $V_{BE} - I_C$ characteristics of the pair of transistors Tr$_1$ and Tr$_2$ are well matched with each other, $I_{S1}$ is nearly equal to $I_{S2}$ and the equation described above can be approximated by the following equation;

$$I_{C2}/I_{C1} = \exp[q(V_{BE2} - V_{BE1})/kT] \tag{7}$$

Substituting equation (6) in equation (7), $$I_{C2}/I_{C1} = \exp(qV_{B1}/kT) \quad (8)$$

is obtained. Dividing equation (4) by equation (3);

$$I_{C2}/I_{C1} = (V_{CC}/R_2)/(V_{CC}/R_1) = R_1/R_2 \quad (9)$$

is obtained. From equations (5), (8) and (9), $$\frac{R_1}{R_2} = \exp(\frac{q}{kT} \cdot \frac{R_3}{R_3 + R_4} \cdot V_T)$$

is obtained. Consequently, the output voltage $V_T$ of the temperature-sensitive voltage generator 100 can be represented by the following equation;

$$V_T = K_T T \quad (10)$$

where $$K_T = \frac{k}{q}(1 + \frac{R_4}{R_3}) \cdot \ln \frac{R_1}{R_2}.$$

Since $K_T$ is a constant independent of the absolute temperature T, the output voltage $V_T$ becomes a temperature-sensitive voltage varying in proportion to the absolute temperature T.

From equation (10), it is obvious that the temperature-sensitive voltage $V_T$ is determined only by the two ratios of resistances, $R_4/R_3$ and $R_1/R_2$, and is independent of the power supply voltage $V_{CC}$. Therefore, the temperature-sensitive voltage generator 100 theoretically has an excellent advantage that the temperature-sensitive voltage generated thereby is not influenced by any fluctuation of the power supply voltage $V_{CC}$. Because the temperature-sensitive voltage $V_T$ is one of the inputs of the converting means 2, the advantage described above is very valuable.

An analogue multiplier 22 is illustrated in FIG. 1 as an embodiment of the mutliplying means 2. The analogue multiplier means 22 generates an output voltage proportional to the product of two input voltages. Thus, any kind of analogue multiplier, for example, a well-known analogue multiplier and a well-known voltage controlled amplifier the gain of which is linearly controlled by a control voltage, can be used as the analogue multiplier 22.

As described hereinbefore, the analogue multiplier 22 generates an output voltage $V_{TC}$ proportional to the product of the input voltage $V_{IN}$ applied to the terminal 20 and the temperature-sensitive voltage $V_T$. Therefore, using the equation (10), the output voltage $V_{TC}$ is expressed by the following equation;

$$V_{TC} = MV_{IN}V_T = (MK_T)V_{IN}T \quad (11)$$

where M is a proportional constant independent of absolute temperature T. From equation (11), it is apparent that the output voltage $V_{TC}$ varies in proportion to both the input voltage $V_{IN}$ and absolute temperature T.

In FIG. 1, a circuit diagram of a concrete embodiment of the antilogarithmic amplifier 3 is shown. The antilogarithmic amplifier 3 comprises a differential amplifier A$_3$ having a high input impedance, pair of transistors Tr$_3$ and Tr$_4$ well matched as to $V_{BE}-I_C$ characteristics with each other, resistors 31, 32 and 33 which are stable with respect to temperature variation, a capacitor 35, and a resistor 34. The noninverting input of the differential amplifier A$_3$ is grounded through a resistor so as to cancel an offset voltage caused by an input bias current thereof. The capacitor 35 and the resistor 34 cooperatively keep the antilogarithmic amplifier 3 stable with respect to frequency response. The pair of transistors Tr$_3$ and Tr$_4$ is closely arranged thermally to the pair of transistors Tr$_1$ and Tr$_2$ used in the temperature-sensitive voltage generator 100, so that the two pairs are exposed to substantially the same temperature. In order to achieve such an arrangement, it is preferable to enclose the pair of transistors Tr$_1$ and Tr$_2$ and the pair of transistors Tr$_3$ and Tr$_4$ within the same package, or to arrange the two pairs on one monolithic semiconductor chip.

Under the condition that the collector potentials of the pair of transistors Tr$_3$ and Tr$_4$ are nearly equal to their base potentials, respectively, the following equations, as well as equations (1) and (2) represent the relationships between the base-emitter voltages $V_{BE3}$ and $V_{BE4}$ of the pair of transistors Tr$_3$ and Tr$_4$ and the collector currents $I_R$ and $I_C$;

$$I_R = I_{S3} \exp(qV_{BE3}/kT) \quad (12)$$

$$I_C = I_{S4} \exp(qV_{BE4}/kT) \quad (13)$$

where currents $I_{S3}$ and $I_{S4}$ are of reverse saturation currents pair of transistors Tr$_3$ and Tr$_4$, respectively, k is Boltzmann's constant, q is the electron charge and T is the absolute temperature which can be regarded as substantially the same temperature as the absolute temperature T in equations (1) and (2). Because the output of the differential amplifier A$_3$ is fed back through the resistor 34 and the transistor Tr$_3$, the potential of the inverting input thereof becomes the ground potential. Since the input impedance of the differential amplifier A$_3$ is sufficiently high, the collector current $I_R$ is given by the following equation;

$$I_R = V_{CC}/R_5 \quad (14)$$

where $V_{CC}$ is the power supply voltage. The base of the transistor Tr$_3$ is grounded and the emitter of the transistor Tr$_3$ is coupled with that of the transistor Tr$_4$. Defining $V_{B2}$ as the base voltage of the transistor Tr$_4$, the following equation is obtained;

$$V_{BE4} - V_{BE3} = V_{B2} \quad (15)$$

Dividing the equation (13) by the equation (12), the following equation is obtained;

$$I_C/I_R = (I_{S4}/I_{S3}) \exp[q(V_{BE4} - V_{BE3})/kT] \quad (16)$$

In this case, $I_{S3}$ is nearly equal to $I_{S4}$, because the pair of transistors Tr$_3$ and Tr$_4$ are well matched as to the $V_{BE} - I_C$ characteristics. So, the equation (16) can be approximated by the following equation;

$$I_C/I_R = \exp[q(V_{BE4} - V_{BE3})/kT] \quad (17)$$

Substituting the equations (14) and (15) in the equation (17), the equation (17) becomes;

$$I_C = (V_{CC}/R_5) \exp(qV_{B2}/kT) \quad (18)$$

where $$V_{B2} = R_A V_{TC}/(R_A + R_B) \quad (19)$$

Substituting the equation (19) in the equation (18), the equation (18) becomes;

$$I_C = \frac{V_{CC}}{R_5} \exp\left(\frac{R_A}{R_A + R_B} \cdot \frac{qV_{TC}}{kT}\right) \quad (20)$$

Absolute temperature T is included in the exponential term of the equation (20). This indicates that the antilogarithmic amplifier 3 has a fatally large temperature dependence and an antilogarithmic conversion characteristic.

Now, substituting the equation (11), i.e. the equation for the output voltage $V_{TC}$ from the analogue multiplier, in equation (20), the equation (20) becomes;

$$I_C = \frac{V_{CC}}{R_5} \exp\left(\frac{R_A}{R_A + R_B} \cdot \frac{qMK_TV_{IN}T}{kT}\right)$$

Consequently, because the absolute temperature T in the denominator of the equation shown above can be cancelled by the absolute temperature T in the numerator, the output current $I_C$ of the antilogarithmic amplifier 3 can be represented by the following equation;

$$I_C = \frac{V_{CC}}{R_5} \exp\left(\frac{R_A}{R_A + R_B} \cdot \frac{qMK_T}{k} \cdot V_{IN}\right) \quad (21)$$

From the equation (21), it is apparent that the output current $I_C$ of the antilogarithmic amplifier 3 does not include any term corresponding to the absolute temperature T. Therefore, the output current $I_C$ is theoretically stable with respect to temperature variation.

Figure 2:
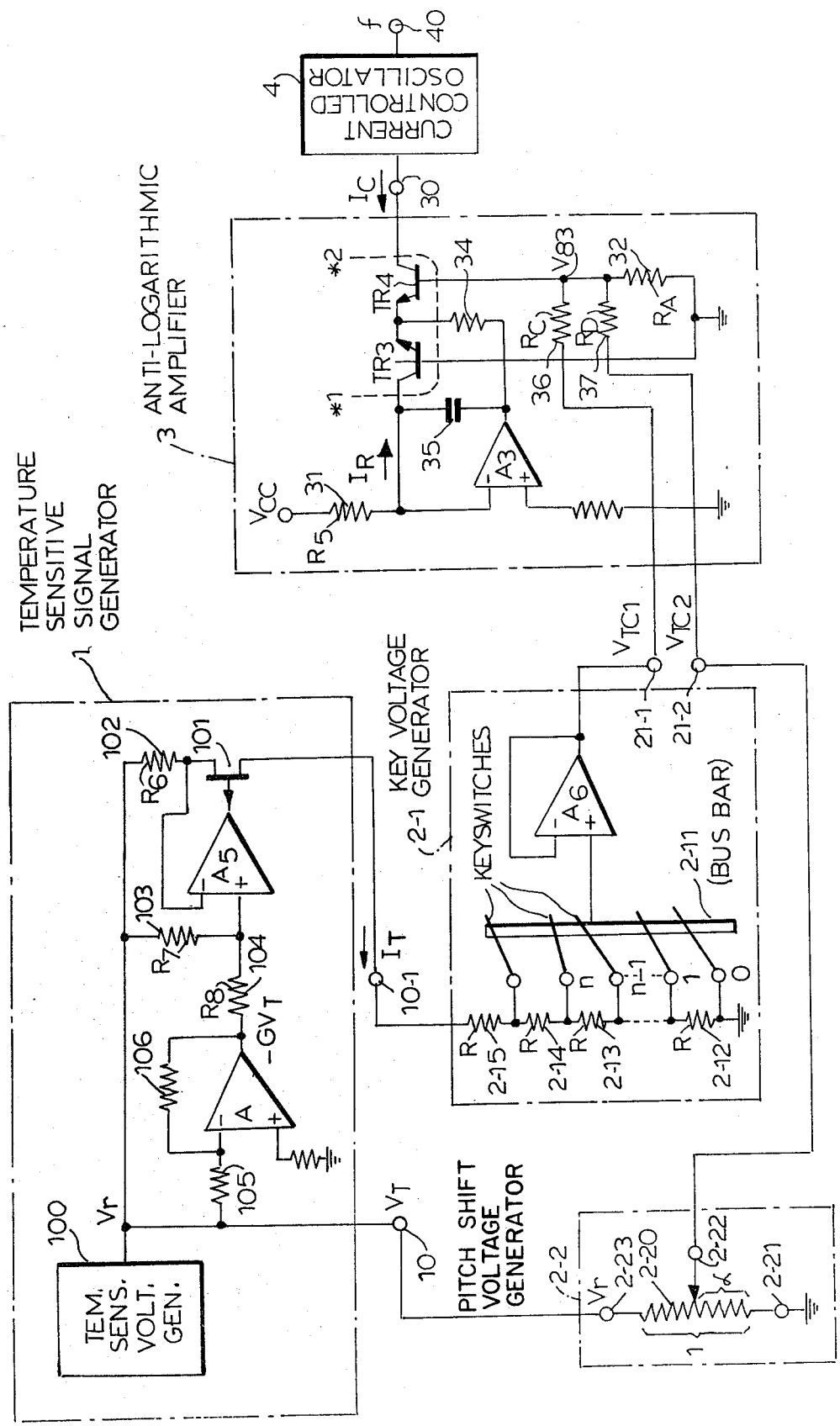
FIG. 2 is a circuit diagram of an embodiment of a tone generator of a music synthesizer, in which the temperature-compensated antilogarithmic converter of the present invention is used.

FIG. 2 shows an embodiment of the temperature-compensated antilogarithmic converter which is used for a tone generator of an electronic musical instrument, particularly a music synthesizer. Most of music synthesizers have VCO's or CCO's (current controlled oscillators) as their tone generators so as to generate tone frequencies corresponding to depressed keys. In their tone generators, generally, the VCO's (or CCO's) are controlled by equal ratio voltages (or equal ratio currents) which are antilogarithmically converted by antilogarithmic amplifiers from equal difference voltages corresponding to the depressed keys, so as to generate tone frequencies corresponding to pitches of the depressed keys. Most of these antilogarithmic amplifiers make use of semiconductor devices including P-N junctions, such as transistors or diodes, as antilogarithmic elements. As described in the introductory portion of the present specification, these conventional antilogarithmic amplifiers cannot completely be compensated for the effect of temperature variation on their antilogarithmic conversion characteristics. Therefore, the stabilities of the tone frequencies are not sufficiently high with respect to temperature variations of these conventional music synthesizers.

In FIG. 2, the tone generator of the music synthesizer having highly stabilized tone frequencies with respect to temperature variation is achieved by using the temperature-compensated antilogarithmic converter of the present invention. In the embodiment shown in FIG. 2, a key-voltage generator 2-1 and a pitch shift-voltage generator 2-2 are used as multiplying means corresponding to converter 2 of FIG. 1, and the temperature-sensitive signal generator 1 generates both the temperature-sensitive voltage $V_T$ and a temperature-sensitive current $I_T$, both of which vary in proportion to absolute temperature T and which are generated at terminals 10 and 10-1, respectively. In the temperature-sensitive signal generator 1 in FIG. 2, a temperature-sensitive voltage generator 100 is the same circuit as the temperature-sensitive voltage generator 100 in FIG. 1, and it generates the temperature-sensitive voltage $V_T$ given by the equation (10). A differential amplifier $A_4$ operates as a well known inverting amplifier with resistors 105 and 106 which are stable with respect to temperature variation. A differential amplifier $A_5$ having a high input impedance operates as a current source with an FET (field effect transistor) 101 and with resistors 102, 103 and 104 which are stable with respect to temperature variation.

An inverting input and a noninverting input of the differential amplifier $A_5$ are kept at substantially the same potential as each other. The value of the output current $I_T$ generated from the drain of the FET 101 is equal to a value which is the voltage across the resistor 103 divided by the resistance $R_6$ of the resistor 102. Defining -G (G is a positive constant) as the gain of the inverting amplifier composed of the differential amplifier $A_4$, the output voltage of the inverting amplifier ($A_4$) becomes $-GV_T$. Therefore, the voltage across the resistor 103 becomes;

$$\frac{R_7}{R_7 + R_8}(1 + G)V_T$$

and thus the output current $I_T$ of the temperature-sensitive signal generator 1 is represented by the following equation;

$$I_T = K_C V_T \quad (22)$$

where $$K_C = \frac{R_7}{R_6(R_7 + R_8)}(1 + G).$$

Using the equation (10), the equation (22) becomes;

$$I_T = K_T K_C T \quad (23).$$

As both $K_T$ and $K_C$ are independent of absolute temperature T, the output current $I_T$ is proportional to absolute temperature T. Therefore, $I_T$ can be called a temperature-sensitive current.

The key-voltage generator 2-1 which is part of the multiplying means generates equal difference voltages varying in proportion to the absolute temperature and also corresponding to the depressed keys, at a terminal 21-1. The "input signal" to be applied to the key-voltage generator 2-1 is information according to the selection of the key depressed. A differential amplifier $A_6$ having a high input impedance operates as a voltage follower and generates a voltage at a low impedance at the output thereof, i.e. a bus bar 2-11. Resistors 2-12, 2-13, 2-14 and 2-15 which are stable with respect to temperature variation have substantially the same resistance R as each other, and are connected in series to each other. One terminal of the resistor 2-12 is grounded. One terminal of the resistor 2-15 is coupled with the output terminal 10-1 of the temperature-sensitive signal generator 1. In FIG. 2, the keyswitches are arranged, for example, in such way that the higher the tone frequency, the larger the number n for the key. Therefore, the keyswitch numbered zero, that is, the keyswitch the terminal of which is grounded, corresponds to the lowest tone frequency.

Now, when all of the keyswitches are opened, the voltage generated between the terminals of any two adjacent keyswitches is equal to $RI_T$ regardless of the position of the keys. When any one of the keyswitches is closed, the voltage follower consisting of the differential amplifier $A_6$ generates a voltage at a low impedance. Such voltage corresponds to the voltage of the terminal of the closed keyswitch, and is supplied to the bus bar 2-11. When two or more keyswitches are closed at the same time, all terminals of the closed keyswitches are short-circuited by the bus bar 2-11 and become the same voltage as each other. Therefore, the key-voltage generator 2-1 generates a voltage for the keyswitch corresponding to the lowest tone frequency of the closed keyswitches. That is, the key-voltage generator 2-1 has the function of a priority selector for lower tone priority of a musical scale and generates an equal difference voltage between any two adjacent keyswitches.

As shown in FIG. 2, when the keyswitch numbered n is closed, the output voltage $V_{TC1}$ of the key-voltage generator 2-1 becomes;

$$V_{TC1}=nRI_T \tag{24}$$

where $n=0, 1, 2, 3, \ldots$ Substituting the equation (23) in equation (24), the equation (24) becomes;

$$V_{TC1}=n\, RK_T K_C T \quad (n=0, 1, 2, 3, \ldots) \tag{25}$$

From the equation (25), it is apparent that the output voltage $V_{TC1}$ varies in proportion to the absolute temperature T, because n, R, $K_T$ and $K_C$ are all constants independent of absolute temperature T. And it is also apparent that the output voltage $V_{TC1}$ varies in proportion to the number n of the depressed keyswitch, where n is regarded as "the input signal".

Next, the pitch-shift-voltage generator 2-2 forming one of the parts of the multiplying means generates a shift-voltage which varies in proportion to absolute temperature T and which is settable by a manual setting means. The pitch-shift-voltage generator 2-2 totally shifts a plurality of tone frequencies which can be selected by the key-voltage generator 2-1 so as to transpose the tones to a desirable tone range and hence tune the tones to a desirable frequency. The "input signal" applied to the pitch-shift-voltage generator 2-2 can be regarded as information as to the setting position of a travelling contact of a potentiometer. A first terminal 2-21 of the potentiometer 2-20 is grounded and a third terminal 2-23 is supplied with the temperature-sensitive voltage $V_T$ which is one of the outputs of the temperature-sensitive signal generator 1. The pitch-shift-voltage generator 2-2 generates an output voltage $V_{TC2}$ at a second terminal 2-22, i.e. a travelling contact, of the potentiometer 2-20. When the second terminal 2-22 is located at a position between the first and the third terminals, such position being designated by $\alpha$ ($0 \leq \alpha \leq 1$), then the output voltage $V_{TC2}$ generated at the second terminal 2-22 is represented by the following equation;

$$V_{TC2}=\alpha V_T \tag{26}$$

Substituting the equation (10) in equation (26), the equation (26) becomes;

$$V_{TC2}=\alpha K_T T \tag{27}$$

From the equation (27), it is apparent that the output voltage $V_{TC2}$ of the pitch-shift-voltage generator 2-2 varies in proportion to both absolute temperature T and the constant $\alpha$ which stands for the setting position of the travelling contact of the potentiometer 2-20 and which is regarded as the "input signal".

In FIG. 2, the antilogarithmic amplifier 3 has two input terminals and is a circuit in which resistors 36 and 37 are merely substituted for the resistor 33 of the antilogarithmic amplifier 3 in FIG. 1. Therefore, the antilogarithmic amplifier 3 generates an output current $I_C$ which can be represented by the same equation as the equation (18), except that $V_{B2}$ in equation (18) is replaced by the base voltage $V_{B3}$ of the transistor $Tr_4$ in FIG. 2. That is, the output current $I_C$ of the antilogarithmic amplifier 3 in FIG. 2 is given by the following equation;

$$I_C = \frac{V_{CC}}{R_5} \exp\left(\frac{qV_{B3}}{kT}\right) \tag{28}$$

Here, the resistors 36 and 37 are stable with respect to temperature variation. The base voltage $V_{B3}$ of the transistor $Tr_4$ is represented by the following equation;

$$V_{B3}=K_1 V_{TC1}+K_2 V_{TC2} \tag{29}$$

where $$K_1=R_D R_A/(R_A R_C+R_C R_D+R_D R_A)$$

$$K_2=R_A R_C/(R_A R_C+R_C R_D+R_D R_A)$$

Substituting the equation (29) in equation (28), the equation (28) becomes;

$$I_C=(V_{CC}/R_5)\exp[q(K_1 V_{TC1}+K_2 V_{TC2})/kT] \tag{30}$$

Substituting the equations (25) and (27) in the equation (30), the equation (30) becomes;

$$I_C=(V_{CC}/R_5)\exp[qK_T(K_1 K_C RnT+K_2\cdot\alpha T)/kT]$$

Consequently, because the absolute temperature T of the denominator of the equation shown above is cancelled by the absolute temperature T of the numerator, the output current $I_C$ of the antilogarithmic amplifier 3 can be represented by the following equation;

$$I_C=(V_{CC}/R_5)\exp[qK_T(K_1 K_C R\cdot n+K_2\cdot\alpha)/k] \tag{31}$$

From the equation (31), it is apparent that the output current $I_C$ of the antilogarithmic amplifier 3 does not include the term corresponding to absolute temperature T. Therefore, it is theoretically stable with respect to temperature variation.

In FIG. 2, a current controlled oscillator 4 oscillates at a frequency which is proportional to a control current $I_C$ supplied to the terminal 30. The oscillation frequency finally results in the tone frequency. That is, the tone frequency f is expressed by the following equation;

$$f=K_0 I_C \tag{32}$$

where $K_0$ is a proportional constant. Substituting the equation (31) in the equation (32), the tone frequency f becomes;

$$f=(K_0 V_{CC}/R_5)\exp[qK_T(K_1 K_c R\cdot n + K_2\cdot\alpha)/k] \qquad (33)$$

If the current controlled oscillator 4 has a high temperature stability, that is, if the proportional constant $K_0$ is stable with respect to temperature variation, the equation (33) does not include any term corresponding to absolute temperature T and thus the tone frequency f becomes stable with respect to temperature variation. It is particularly important that there is no absolute temperature term T in the exponential term of the equation (33). Thus the temperature stability of equal ratio variations of the tone frequency f becomes extremely high. The equation (33) shows that the tone frequency f is determined by both the key information n representing the depressed key and the pitch-shift information α expressing how much the tone frequency is to be shifted. As both n and α are in the exponential term of the equation (33), equal variations of n or α are converted into equal ratio variations of the tone frequency f. If all of the constants in the equation (33) are chosen to give the tone generator a desirable frequency, the tone frequency f of the tone generator shown in FIG. 2 is not influenced by the temperature variation.

When making a practical embodiment of the tone generator shown in FIG. 2, it is preferable, for example, to enclose the pair of transistors $Tr_1$ and $Tr_2$ used in the temperature-sensitive voltage generator 100 and the pair of transistors $Tr_3$ and $Tr_4$ used in the antilogarithmic amplifier 3 within the same package, or to arrange such two pairs of transistors on one monolithic semiconductor chip, so that such transistors are exposed to substantially same temperature.

As mentioned above, there can be one or more multiplying means for each antilogarithmic amplifier 3. Moreover, there can be one or more antilogarithmic amplifiers for a single temperature-sensitive signal generator 1. In such cases, of course, both the semiconductor device having at least one P-N junction of each antilogarithmic amplifier and that of the temperature-sensitive signal generator must be exposed to substantially the same temperature.

Now, in the embodiment of the tone generator of the music synthesizer of FIG. 2, to which the present invention is applied, a current controlled oscillator is used for element 4. A current controlled filter, the cutoff frequency (or a resonant frequency) of which varies in proportion to a control current, can also be used for the element 4 instead of the current controlled oscillator, and in such case, the part of the multiplying means designated by 2-2 must be a cutoff frequency shift-voltage generator (or a resonant frequency shift-voltage generator). A signal filtered through said current controlled filter is used as a tone signal, as well as the tone signal of the tone generator mentioned above. The embodiment shown in FIG. 2 consequently becomes a tone color control circuit for the music synthesizer, to which the present invention is applied. That is, an application of the present invention as the tone color control circuit of the music synthesizer is very useful.

Figure 3:
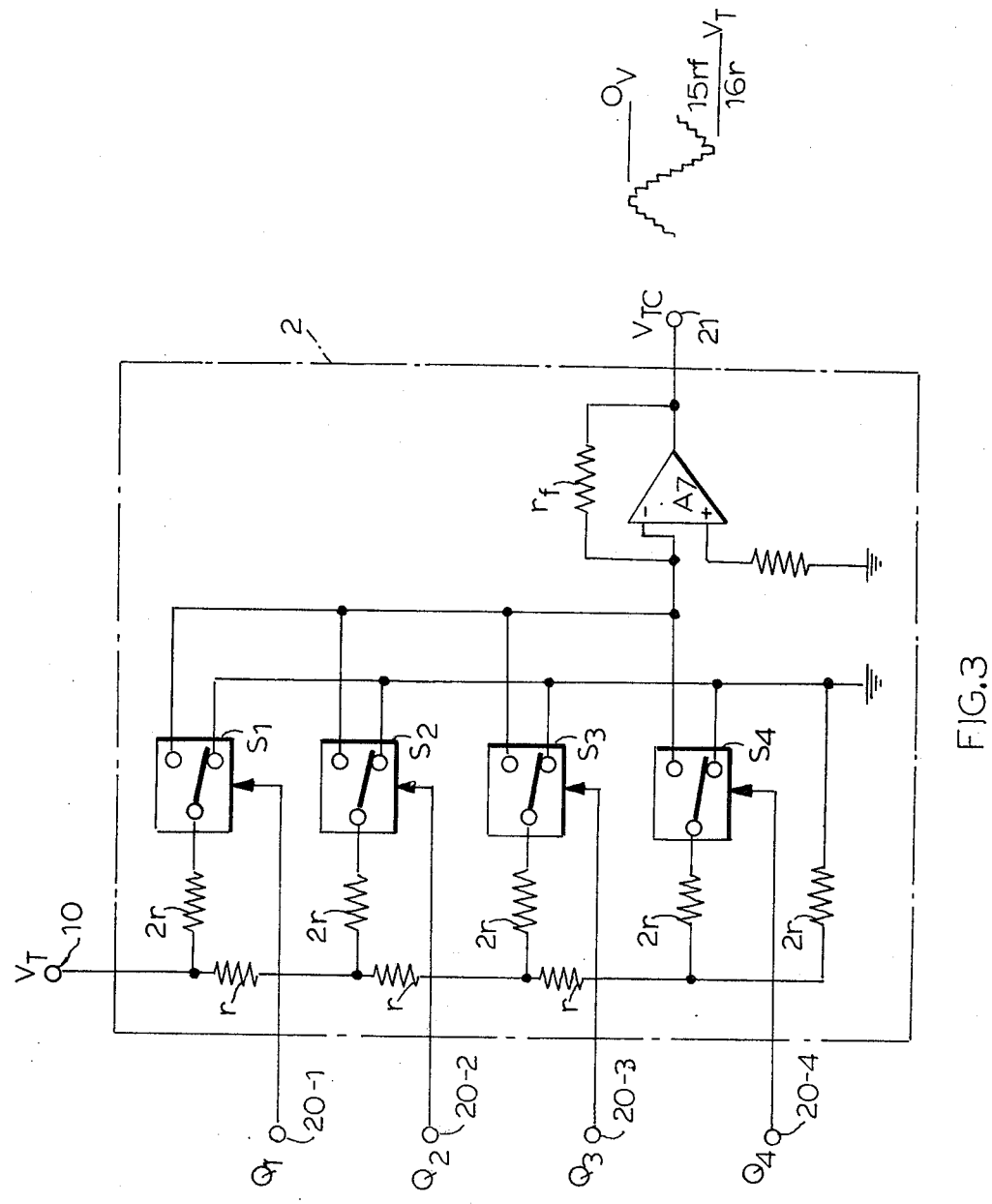
FIG. 3 is a circuit diagram of another embodiment of a converting means which can be used in the converter of FIG. 1.

FIG. 3 shows another embodiment of the multiplying means 2 illustrated in FIG. 1, wherein the input signal applied to the converting means 2 is a digital signal. Referring to FIG. 3, the multiplying means 2 comprises a four-bit digital-to-analog converter using an R-2R ladder type resistor network. A differential amplifier $A_7$ comprises a current-to-voltage converter with a feedback resistor $r_f$ having a resistance $r_f$. Current switches $S_1$, $S_2$, $S_3$ and $S_4$ are controlled by digital input signals $Q_1$, $Q_2$, $Q_3$ and $Q_4$ supplied to input terminals 20-1, 20-2, 20-3 and 20-4 of the four-bit digital-to-analog converter 2 as the multiplying means, respectively. Because the temperature-sensitive voltage $V_T$ acting as a reference voltage for the four-bit digital-to-analog converter 2 is supplied to a terminal 10, the currents flowing through the current switches $S_1$, $S_2$, $S_3$ and $S_4$ can be expressed by $8V_T/16r$, $4V_T/16r$, $2V_T/16r$ and $V_T/16r$, respectively. When each of the digital input signals $Q_1$, $Q_2$, $Q_3$ and $Q_4$ is logic "1", the current switches $S_1$, $S_2$, $S_3$ and $S_4$ are connected to the inverting input of the differential amplifier $A_7$, respectively. And also, when each of the digital input signals $Q_1$, $Q_2$, $Q_3$ and $Q_4$ is logic "0", the current switches $S_1$, $S_2$, $S_3$ and $S_4$ are connected to ground, respectively. Therefore, if each of the digital input signals $Q_1$, $Q_2$, $Q_3$ and $Q_4$ represents the numerals 1 and 0 corresponding to the logics "1" and "0", the output voltage $V_{TC}$ generated at the output terminal 21 of the four-bit digital-to-analog converter 2 is represented by the following equation;

$$V_{TC}=r_f(8Q_1+4Q_2+2Q_3+Q_4)V_T/16r \qquad (34)$$

Substituting the equation (10) in equation (34), the equation (34) becomes;

$$V_{TC}=-K_T r_f(8Q_1+4Q_2+2Q_3+Q_4)T/16r \qquad (35)$$

From the equation (35), it is apparent that if the ratio $r_f/r$ is stable with respect to temperature variation, the output voltage $V_{TC}$ varies in proportion to absolute temperature T.

In the embodiment shown in FIG. 3, a four bit digital-to-analog converter is used for convenience of explanation. However, it is obvious that a digital-to-analog converter for a larger number of bits can be used for the multiplying means 2.

As described hereinbefore, the present invention solves the difficulty of the temperature compensation of the characteristic of antilogarithmic conversion, which difficulty is inherent in a conventional antilogarithmic converter using semiconductor P-N junctions as antilogarithmic elements. Moreover, the present invention is so valuable that any apparatus to which the antilogarithmic converter is applied can theoretically be stabilized, and that, for example, music synthesizers and so on be completely compensated for temperature variations without any adjustment and regardless of dispersions of temperature compensating characteristics. Thus, the antilogarithmic converter of the present invention is greatly superior in its temperature stability to the conventional antilogarithmic converter. While a particular embodiment of the present invention is described hereinbefore, it will be apparent that various modifications can be made in the form and construction thereof without departing from the fundamental principles of the present invention. It is, therefore, desired by the following claims, to include within the scope of the present invention all similar and modified forms of the circuits disclosed, and by which the results of the invention can be obtained.

What is claimed is:

1. A temperature-compensated antilogarithmic converter comprising: a temperature-sensitive signal generator including a first semiconductor device having at least one P-N junction as a temperature-sensitive element for generating at least one electric signal which varies in proportion to the absolute temperature of said first semiconductor device; a multiplying means coupled to said signal generator for multiplying said at least one electric signal and an input signal applied to an input terminal thereof into a product signal which varies in proportion to both said input signal and the absolute temperature of said first semiconductor device; and an antilogarithmic amplifier connected to the output of said multiplying means and including a second semiconductor device having at least one P-N junction as an antilogarithmic element for converting said product signal into an antilogarithmic output signal which varies in proportion to the antilogarithm of a value proportional to said product signal and inversely proportional to the absolute temperature of said second semiconductor device, both said first and second semiconductor devices being positioned for being exposed to substantially the same temperature, whereby said antilogarithmic output current is temperature compensated by said at least one electric signal.

2. A temperature-compensated antilogarithmic converter as claimed in claim 1, wherein said temperature-sensitive signal generator comprises means for generating a voltage signal as said at least one electric signal.

3. A temperature-compensated antilogarithmic converter as claimed in claim 2, wherein said first semiconductor device comprises a first pair of transistors which are well matched at to $V_{BE}$ (base-emitter voltage) vs. $I_C$ (collector current) characteristics.

4. A temperature-compensated antilogarithmic converter as claimed in claim 3, wherein said temperature-sensitive signal generator further comprises a first and a second differential amplifier, a first, a second, a third, a fourth and a fifth resistor, and a voltage source which is connected, through said first and second resistors, to the inverting inputs of said first and second differential amplifiers, respectively, the noninverting inputs of said first and second differential amplifiers being coupled to a reference potential, said reference potential being applied also to one terminal of said third resistor and the base of one transistor of said first pair of transistors, respectively, the inverting inputs of said first and second differential amplifiers being connected to the collector of said one transistor and the collector of the other transistor of said first pair of transistors, respectively, the output of said second differential amplifier being connected, through said fifth resistor, to the emitter of said other transistor, the emitter of said one transistor being connected to said emitter of said other transistor, the base of said other transistor being connected to another terminal of said third resistor, the output of said first differential amplifier being connected, through said fourth resistor, to said base of said other transistor, whereby said first differential amplifier generates a temperature-sensitive voltage at the output thereof.

5. A temperature-compensated antilogarithmic converter as claimed in claim 1, wherein said temperature-sensitive signal generator both comprises means for generating a voltage signal and a current signal as said at least one electric signal.

6. A temperature-compensated antilogarithmic converter as claimed in claim 1, wherein said first and second semiconductor devices are enclosed within the same package.

7. A temperature-compensated antilogarithmic converter as claimed in claim 1, wherein said first and second semiconductor devices comprise a first pair of transistors and a second pair of transistors, respectively, which are well matched as to $V_{BE}$ (base-emitter voltage) vs. $I_C$ (collector current) characteristics.

8. A temperature-compensated antilogarithmic converter as claimed in claim 7, wherein said first and second pair of transistors are enclosed within the same package.

9. A temperature-compensated antilogarithmic, converter as claimed in claim 7, wherein said antilogarithmic amplifier further comprises a differential amplifier, a first, a second, a third and a fourth resistors, a reference potential being applied to the noninverting input of said differential amplifier, to the base of one transistor of said second pair of transistors, and to the base of the other transistor of said second pair of transistors through said second resistor, respectively, the inverting input of said differential amplifier being connected, through said first resister, to a voltage source, the collector of said one transistor being connected to said inverting input of said differential amplifier, the output of said differential amplifier being connected, through said fourth resistor, to the emitter of said one transistor, the emitter of said other transistor being connected to said emitter of said one transistor, said third resistor being connected between said base of said other transistor and the output of said converting means, whereby said antilogarithmic amplifier generates said antilogarithmic current at the collector of said other transistor.

10. A temperature-compensated antilogarithmic converter as claimed in claim 1, further comprising input signal supply means constituted by switching means for supplying a switched signal.

11. A temperature-compensated antilogarithmic converter as claimed in claim 10, wherein said switching means are electronic switches.

12. A temperature-compensated antilogarithmic converter as claimed in claim 10, wherein said switching means are mechanical switches.

13. A temperature-compensated antilogarithmic converter as claimed in claim 12, wherein said mechanical switches are keyswitches having a bus bar as a stationary contact.

14. A temperature-compensated antilogarithmic converter as claimed in claim 13, wherein said multiplying means further comprises a voltage follower, each two adjacent terminals of said plurality of keyswitches being connected, through a resistor, to each other, a fixed potential being applied to the keyswitch corresponding to the lowest pitch note or the highest pitch note, a keyswitch corresponding to the highest pitch note or the lowest pitch note being supplied with said at least one electric signal which is an output current of said temperature-sensitive signal generator, said bus bar being connected to the input of said voltage follower, whereby said multiplying means generates an output voltage at the output of said voltage follower when any one of said plurality of keyswitches is activated.

15. A temperature-compensated antilogarithmic converter as claimed in claim 1, wherein said multiplying means has a potentiometer in the input stage thereof through which said input signal is supplied.

16. A temperature-compensated antilogarithmic converter as claimed in claim 15, wherein said potentiometer is provided with stationary terminals across which the input signal is supplied and further has a travelling contact thereof, at which is generated a variable voltage.

17. A temperature-compensated antilogarithmic converter as claimed in claim 1, wherein said input signal is an analogue signal and said multiplying means is an analogue multiplier for multiplying said analogue signal by said at least one electric signal.

18. A temperature-compensated antilogarithmic converter as claimed in claim 1, wherein said input signal is a digital signal and said multiplying means comprises a multiplier for multiplying said digital signal by said at least one electric signal.

19. A temperature-compensated antilogarithmic converter as claimed in claim 18, wherein said multiplier is a digital-to-analog converter which comprises a differential amplifier, a resistor network provided with said electric signal, and switching means actuated by said digital signal for selection of a ratio of resistances of said resistor network, said differential amplifier being connected to said resistor network for generating said product signal, and in which the voltage of said electric signal is multiplied by said ratio of resistances.

20. A temperature-compensated antilogarithmic converter comprising: a temperature-sensitive voltage and current generator having a first pair of transistors which have $V_{BE}$ (base-emitter voltage) vs. $I_C$ (collector current) characteristics well matched with each other as temperature-sensitive elements for generating an output voltage and an output current both of which vary in proportion to the absolute temperature of said first pair of transistors; a key-voltage generator having keyswitches with a bus bar as a common terminal thereof and coupled to said generator for receiving the output current from said temperature-sensitive voltage and current generator, and for generating a key-voltage varying in proportion to the absolute temperature of said first pair of transistors and varying also in accordance with an activated keyswitch from among said keyswitches; a shift-voltage generator coupled to said temperature-sensitive voltage and current generator for receiving said output voltage and having a potentiometer for generating a shift-voltage which varies in proportion to both the absolute temperature of said first pair of transistors and the resistance setting of said potentiometer; and an antilogarithmic amplifier coupled to said key-voltage generator and said shift-voltage generator for receiving said key-voltage and said shift-voltage and having a second pair of transistors which have $V_{BE}$ vs. $I_C$ characteristics well matched with each other as antilogarithmic elements, for converting both said key-voltage and said shift-voltage into an antilogarithmic output current which is in proportion to the antilogarithm of a valve proportional to said key-voltage and said shift-voltage and inversely proportional to the absolute temperature of said second pair of transistors, said first and second pair of transistors being positioned for being exposed to substantially the same temperature, whereby said antilogarithmic output current is compensated with respect to temperature by said output voltage and current of said temperature-sensitive voltage and current generator.

* * * * *